United States Patent
Grunow et al.

(10) Patent No.: US 7,037,837 B2
(45) Date of Patent: May 2, 2006

(54) METHOD OF FABRICATING ROBUST NUCLEATION/SEED LAYERS FOR SUBSEQUENT DEPOSITION/FILL OF METALLIZATION LAYERS

(75) Inventors: Stephan Grunow, Dallas, TX (US); Satyavolu Srinivas Papa Rao, Garland, TX (US); Noel M. Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 10/903,598

(22) Filed: Jul. 29, 2004

(65) Prior Publication Data

US 2006/0024939 A1    Feb. 2, 2006

(51) Int. Cl.
*H01L 21/44* (2006.01)
(52) U.S. Cl. ................................ 438/687; 438/680
(58) Field of Classification Search ............. 438/687, 438/694, 643, 653, 679, 680, 627, 584, 618
See application file for complete search history.

(56) References Cited

U.S. PATENT DOCUMENTS

| | | | |
|---|---|---|---|
| 5,114,556 A * | 5/1992 | Lamont, Jr. .......... | 204/192.12 |
| 5,707,486 A * | 1/1998 | Collins ................. | 156/345.38 |
| 6,488,823 B1 * | 12/2002 | Chiang et al. ........ | 204/192.15 |
| 6,562,715 B1 * | 5/2003 | Chen et al. .......... | 438/643 |
| 2002/0070375 A1 | 6/2002 | Chiang et al. ....... | 252/512 |
| 2003/0119325 A1 * | 6/2003 | Jeong et al. ......... | 438/694 |
| 2005/0032369 A1 * | 2/2005 | Ding et al. .......... | 438/687 |
| 2005/0206000 A1 * | 9/2005 | Aggarwal et al. ... | 257/758 |

* cited by examiner

*Primary Examiner*—B. William Baumeister
*Assistant Examiner*—Victor V. Yevsikov
(74) *Attorney, Agent, or Firm*—Jacqueline J. Garner; W. James Brady, III; Frederick J. Telecky, Jr.

(57) ABSTRACT

A method for fabricating a seed layer. A seed layer (126) is deposited over a barrier layer (124) using a three-step process comprising a low AC bias power step, a high AC bias power step, and a lower/zero AC bias power step. The low AC bias power step provides low overhang. The high AC bias power step provides good sidewall coverage. The lower/zero AC bias step recovers areas exposed by re-sputtering during the high AC bias power step.

31 Claims, 3 Drawing Sheets

METHOD OF FABRICATING ROBUST NUCLEATION/SEED LAYERS FOR SUBSEQUENT DEPOSITION/FILL OF METALLIZATION LAYERS

FIELD OF THE INVENTION

The invention is generally related to the field of fabricating integrated circuits and more specifically to fabricating nucleation/seed layers in contacts, vias, and copper interconnects in semiconductor devices.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any liner/barrier metals) is deposited, patterned, and etched to form the interconnect lines. Then, a dielectric is deposited and planarized. In a damascene process, the dielectric is formed first. The dielectric is then patterned and etched. A thin liner/barrier material is then deposited over the structure followed by copper deposition over the liner/barrier material. Then, the copper and liner/barrier material are chemically-mechanically polished to remove the material from over the dielectric, leaving metal interconnect lines. A metal etch is thereby avoided.

The most practical technique for forming copper interconnects is electrochemical deposition (ECD). In this process, after the liner/barrier material is deposited, a seed layer of copper is deposited. Then, ECD is used to deposit copper over the seed layer. Unfortunately, physical vapor deposition (PVD) processes typically used to deposit the liner/barrier and seed materials have poor step coverage. This is due to the fact that PVD processes use a line of sight technique. As a result, an overhang of the liner/barrier and/or seed material occurs at the top of a trench or via. The overhang causes a severe problem during the subsequent copper ECD. Specifically, a seam can occur in the copper fill material.

One proposed solution for overcoming the above problem uses a pre-sputter etch after the trench and via or contact etch, but before liner/barrier deposition. Unfortunately, the sputter etch step can deposit copper onto the sidewalls. Copper can then diffuse through the dielectric and cause reliability problems. Also, the use of a pre-sputter etch can lead to faceting/corner rounding of the features, making the adjacent structures more prone to electrical leakage due to a reduction of line-to-line separation distance.

SUMMARY OF THE INVENTION

The invention is a three or more step deposition of nucleation/seed layers. The first step uses a low AC bias for minimal resputtering and overhang during the deposition of the nucleation/seed layer. The second step uses a high AC bias to provide sufficient sidewall coverage. The third step uses a low or no AC bias to minimize the resputter component and provide coverage of areas exposed during the resputtering of the second step. A metal fill process may then be performed.

An advantage of the invention is providing a nucleation/seed layer with improved coverage that may, for example, result in a robust fill during a subsequent metal deposition step.

This and other advantages will be apparent to those of ordinary skill in the art having reference to the specification in conjunction with the drawings.

DETAILED DESCRIPTION OF THE EMBODIMENTS

The invention will now be discussed with reference to a copper seed physical vapor deposition (PVD) process for a dual damascene process. It will be apparent to those of ordinary skill in the art that the invention may be applied to other PVD processes such as other copper seed layer applications and other nucleation/seed layers, such as alloys of copper (e.g., Cu—Al, Cu—Sn, Cu—Ag, etc.), or materials such as Ru or Ir, for subsequent deposition/fill of metallization layers.

Figure 1A:
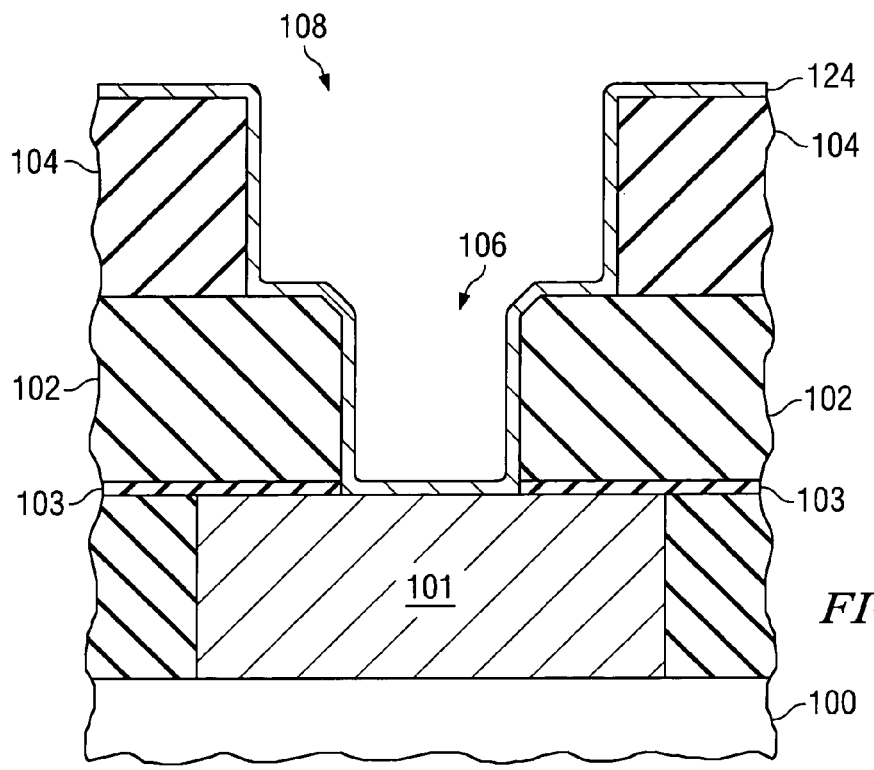
FIGS. 1A–1F are cross-sectional drawings of a copper interconnect structure formed according to an embodiment of the invention at various stages of fabrication.

A method for fabricating a copper dual damascene interconnect structure according to an embodiment of the invention will now be discussed with reference to FIGS. 1A–1F. A semiconductor body 100 is processed through formation of trench and vias in a metal interconnect level, as shown in FIG. 1A. Semiconductor body 100 typically comprises a silicon substrate with transistors and other devices formed therein. Semiconductor body 100 may also include one or more metal interconnect layers. One such copper interconnect, 101, is shown.

An ILD (interlevel dielectric) 102 is formed over semiconductor body 100 (including copper interconnect 101). An etchstop layer 103 is typically placed underneath ILD 102. IMD (intrametal dielectric) 104 is formed over ILD 102. An additional etchstop layer (not shown) may optionally be placed between ILD 102 and IMD 104. Suitable dielectrics for ILD 102 and IMD 104 include, for example, silicon dioxides, fluorine-doped silicate glass (FSG), organo-silicate glass (OSG), silsesquioxane (SSQ)-based materials, e.g., MSQ(methylsilsesquioxane) or hydrogensilsesquioxane (HSQ), organic-polymer-based materials, amorphous-carbon-based materials, and any other dielectric material that is suitable to serve as low-dielectric-constant medium. ILD 102 and IMD 104 are thick dielectric layers and typically have a thickness in the range of 0.05 um–1 um.

In a copper dual-damascene process, both the vias and trenches are etched in the dielectric. Via 106 is etched in ILD 102 (and later, in etchstop layer 103) and trench 108 is etched in IMD 104. Via 106 is used to connect to underlying metal interconnect layer 101. Trench 108 is used to form the metal interconnect lines.

Still referring to FIG. 1A, a barrier/liner layer 124 is deposited over IMD 104 including in trench 108 and via 106. Barrier layer 124 may in fact comprise multiple layers and/or be deposited in several steps. Suitable barrier/liner layers are known in the art. For example, a three-step DED (deposition/etch/deposition) process, such as that described in co-pending U.S. patent application Ser. No. 10/688,452, filed Oct. 18, 2003, assigned to Texas Instruments and hereby incorporated by reference, may be used. In a three-step DED process, a barrier material such as Ta is deposited. This is followed by a partial or complete etching of the barrier material in the bottom of the via 106 to reduce via/contact resistance and improve bottom sidewall coverage. Then, a thin layer of barrier material is deposited to cover any misaligned/unlanded vias.

To assist the copper electrochemical deposition (ECD) process, a copper nucleation/seed layer 126 is typically deposited first over the barrier/liner layer 124. Seed layers are typically deposited using a single- or dual-step PVD process. However, with a 1- or 2-bias (AC wafer bias) insufficient Cu seed coverage along features or excessive overhang can occur, especially in dual damascene integration schemes and for dimensions of 65 nm technology and below. Increasing the AC wafer bias leads to increased re-sputtering of material from the trench and via bottom onto the sidewalls and increased material overhang at the top entrance of features. In particular, beveled surfaces and sharp corners (e.g., beveled transitions between the via and trench, and ridges at the points where the trench is joined to the via) are prone to excessive re-sputtering during higher-AC-wafer-bias conditions. This potentially results in insufficient seed coverage at these locations and reliability/fill issues for subsequent successful ECD Cu. In contrast, the use of minimum/no AC wafer bias leads to insufficient sidewall coverage, leading to insufficient ECD Cu nucleation and fill/reliability.

A combination of two AC bias conditions (low, high) can improve the overall sidewall coverage. However, such a two-step process does not result in robust fill performance during subsequent ECD Cu, mainly due to coverage issues associated with beveled areas.

Accordingly, the seed layer according to the invention is deposited using a minimum three-step process with varying AC bias power. While three deposition steps are discussed below, additional seed layer deposition steps may be performed without departing from the scope of the invention. The AC bias power is a high frequency bias power applied to the wafer. Typically, it is applied to the wafer through the wafer chucking mechanism during a PVD-based Cu seed deposition process. Usually, the frequency is 13.6 MHz, but other allowable radio-frequencies may be used.

Figure 1B:
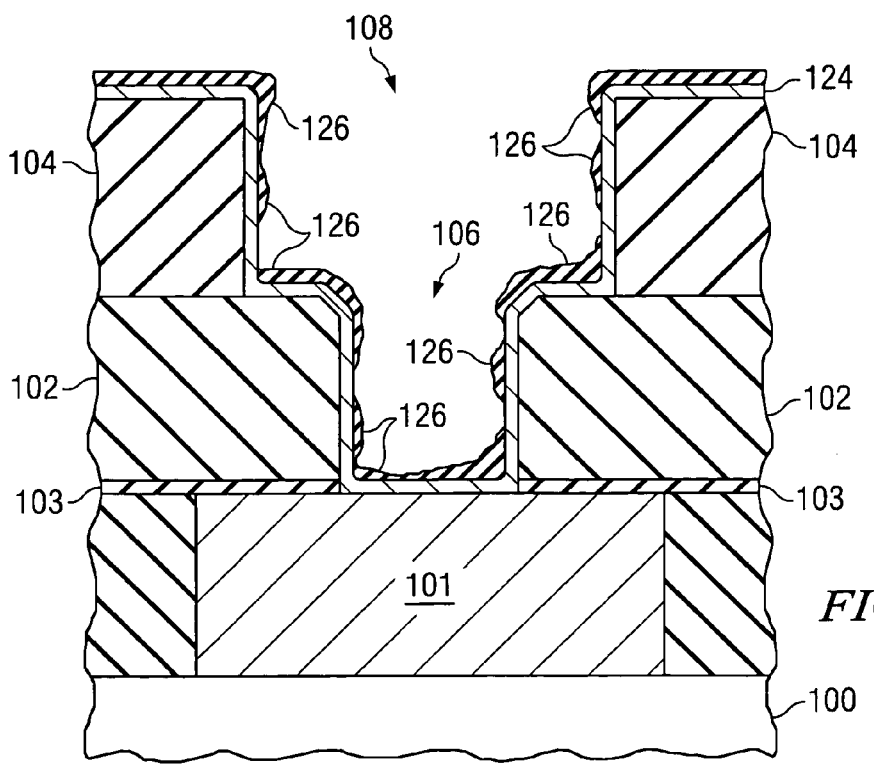

One step uses a low AC bias power to deposit a thin seed layer 126 with minimal overhang at the upper edges of the trench and via, as shown in FIG. 1B. The low AC bias power has a small resputtering component and may be in the range of 0–600 W, preferably 0–400 W. Conformal sidewall coverage will typically not be achieved using this step.

Figure 1C:
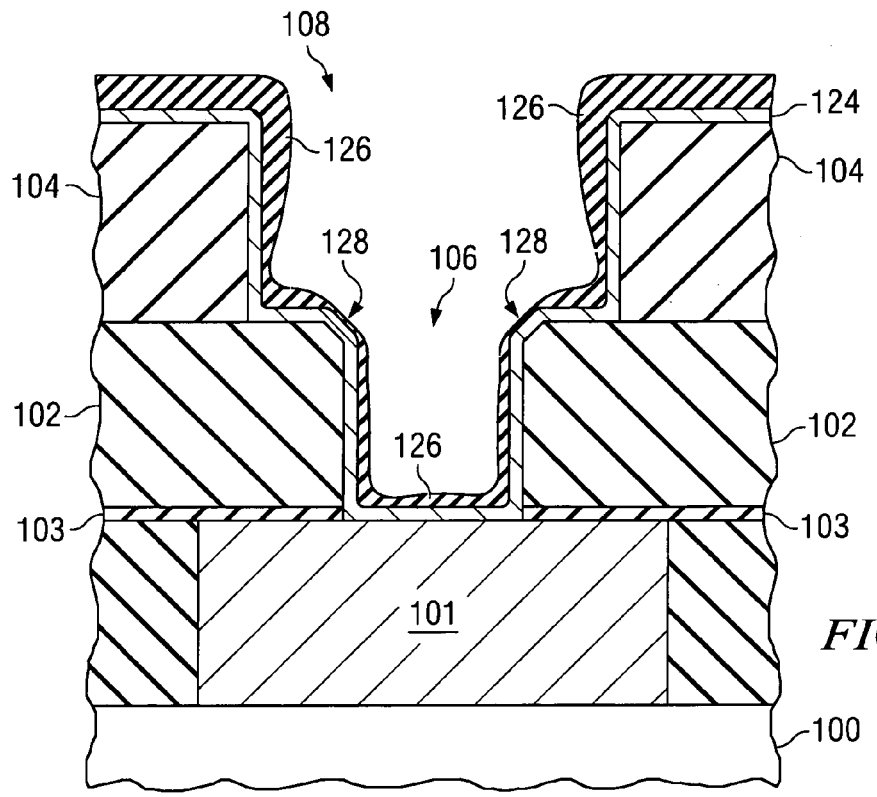

One step uses a high AC bias power to deposit and resputter Cu seed material to provide sufficient sidewall coverage by seed layer 126. The high AC bias condition causes re-sputtering of material from the bottom of the trench and via onto the sidewalls, as shown in FIG. 1C. Re-sputtering may cause areas of the trench and via bottoms, such as areas 128, to be exposed. High AC bias power is higher than the low AC bias power described above and may be in the range of 300–1200 W, preferably 600–1000 W. The low AC bias step and the high AC bias step may be performed in any order. In the preferred embodiment, the low AC bias step is performed before the high AC bias step.

Figure 1D:
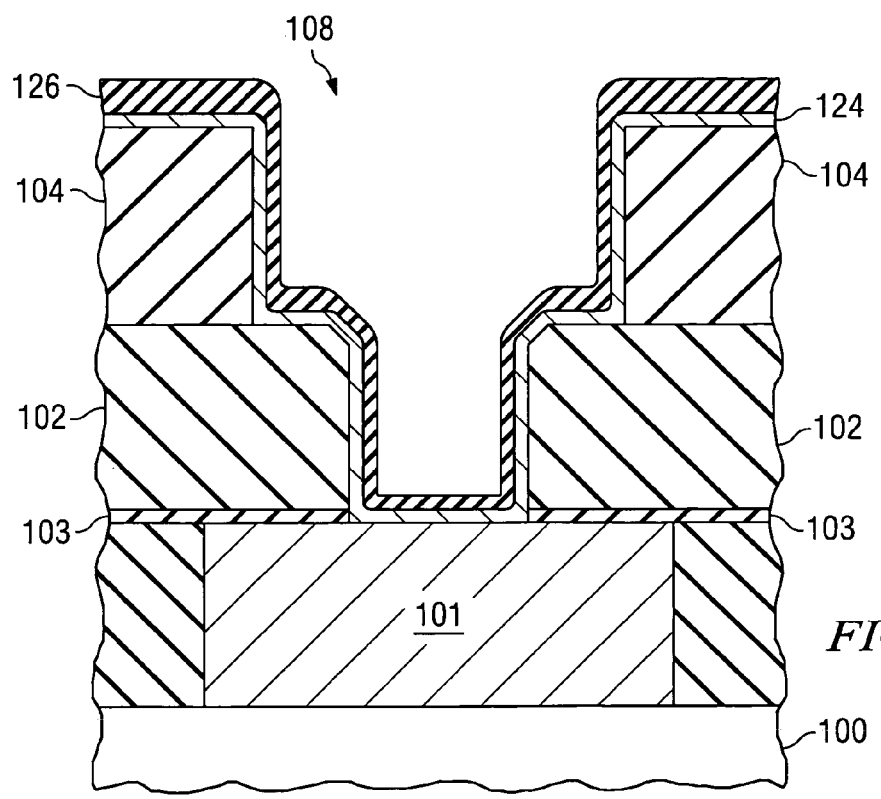

A final step uses a lower/zero AC bias power to deposit additional Cu seed material to recover surfaces including areas that may have been exposed during the high AC bias step. The resulting seed layer 126 is shown in FIG. 1D. The lower AC bias power may be in the range of 0–300 W, preferably 0 W. The lower AC bias power step has minimum/no resputtering component to ensure coverage of the previously re-sputtered areas, e.g., at the corners where the trench and via meet. At the conclusion of the three-step process, seed layer 126 has sufficient coverage throughout the device so as to enable robust deposition/fill during the subsequent Cu ECD step.

A preferred embodiment for the deposition of the seed layer 126 on a 200 mm Cu-seed platform will now be discussed. The wafer temperature may be in the range of approximately +30° C. to −30° C. Updrift of the actual wafer temperature is likely during processing, for example, due to impinging ions on the wafer. The magnitude of the temperature change typically increases with increasing wafer AC wafer bias. It is preferred that the temperature change during deposition be minimized through the use of cooling fluids in the chuck. The target DC power may be in the range of 20–40 kW. The process pressure may be in the range of 0–10 mTorr, preferably 1–2 mTorr. The above described process settings remain unchanged throughout the three-step process. The first step uses a low AC bias power in the range of 0–400 W to deposit Cu to between 20–70% of the final seed layer thickness. Preferably, 50–60% of the final thickness is deposited during this step. The second step uses a high AC bias power in the range of 600–1000 W to deposit additional Cu in an amount between 20–70% of the final seed layer thickness. Preferably, 30–40% of the final thickness is deposited during this step. The third step uses a zero AC bias power to deposit 1–30% of the final seed layer thickness of Cu. Preferably, 10–20% of the final thickness is deposited during this step.

The specific process parameters for the seed layer deposition given above are suitable for a 200 mm platform tool. Optimization and scaling of these process conditions for 300 mm platform tools will be apparent to, and within the skill of, those of ordinary skill in the art having reference to the teachings of the specification.

Figure 1E:
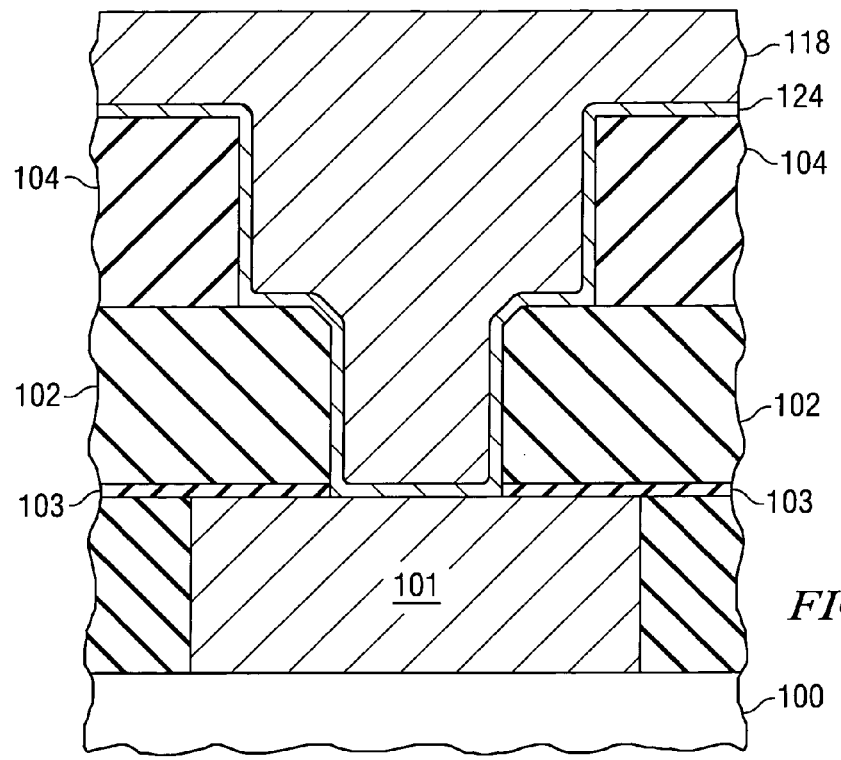

Copper ECD is then performed as shown in FIG. 1E to form copper layer 118. Seed layer 126 becomes part of the final copper layer 118 and accordingly, is not shown in FIG. 1E. However, because final seed layer 126 provides sufficient coverage throughout the wafer, the ECD Cu step reliably fills via 106 and trench 108 without voids or seams. Various copper ECD processes are known in the art. In one example, a 3-step low acid process is used. The wafer is placed in a plating solution with an applied current. A direct current is used. Plating occurs in three steps using a different plating current at each step to control the deposition rate and quality.

Figure 1F:
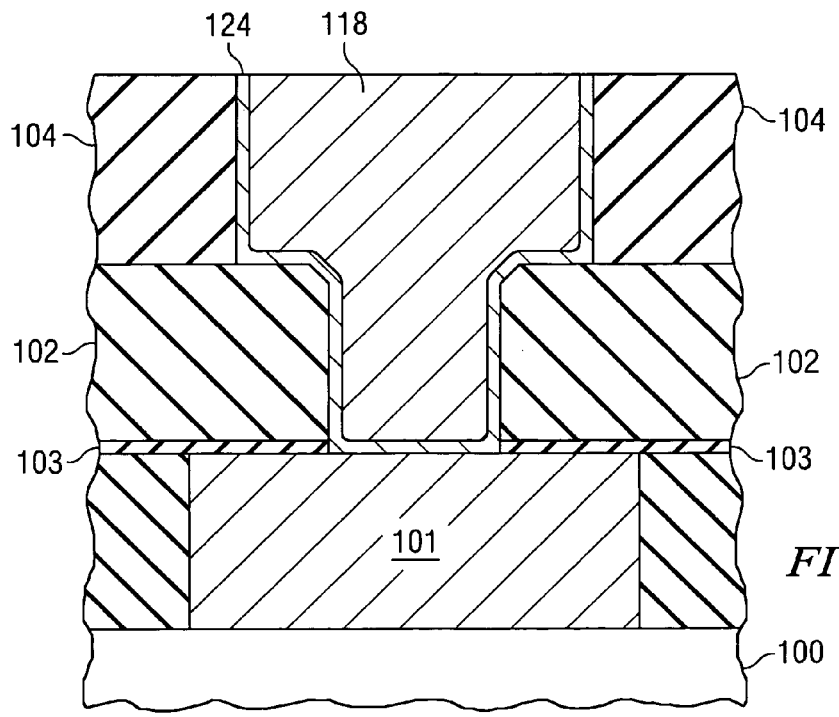

Processing then continues to anneal and chemically-mechanically polish (CMP) the copper layer 118 and barrier/liner 124 to form the copper interconnect, as shown in FIG. 1F. Also, other means of removal of excess metal can be used, such as electro-polishing. Additional metal interconnect layers may then be formed followed by packaging.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the invention may be applied to forming contacts instead of vias. It is therefore intended that the appended claims encompass any such modifications or embodiments.

The invention claimed is:

1. A method of fabricating an integrated circuit, comprising the steps of:

depositing material to form a layer using a low AC bias power;

depositing additional material to said layer using a high AC bias power; and depositing additional material to said layer using a lower AC bias power, wherein said high AC bias power is higher than both said low AC bias power and said lower AC bias power.

2. The method of claim 1, wherein said material comprises copper.

3. The method of claim 1, wherein said material comprises a copper alloy.

4. The method of claim 1, wherein said low AC bias power is in the range of 0 W to 600 W.

5. The method of claim 1, wherein said low AC bias power is in the range of 0 W to 400 W.

6. The method of claim 1, wherein said high AC bias power is in the range of 300 W to 1200 W.

7. The method of claim 1, wherein said high AC bias power is in the range of 600 W to 1000 W.

8. The method of claim 1, wherein said lower AC bias power is in the range of 0 W to 300 W.

9. The method of claim 1, wherein said lower AC bias power is 0 W.

10. The method of claim 1, wherein said step of depositing with said low AC bias power occurs prior to said step of depositing with said high AC bias power.

11. The method of claim 1, wherein said step of depositing with said low AC bias power occurs after said step of depositing with said high AC bias power.

12. A method of fabricating an integrated circuit comprising the steps of:

forming a dielectric layer over a semiconductor body;

forming a hole in said dielectric layer;

depositing a barrier layer over said dielectric layer including in said hole;

depositing a seed layer over said barrier layer using a three-step process comprising a low AC bias power step, a high AC bias power step, and a lower AC bias power step, wherein said high AC bias power step is higher than both said low AC bias power step and said lower AC bias power step; and filling said hole with a metal using an electrochemical deposition process.

13. The method of claim 12, wherein said seed layer comprises copper.

14. The method of claim 12, wherein said seed layer comprises a copper alloy.

15. The method of claim 12, wherein said low AC bias power is in the range of 0 W to 400 W.

16. The method of claim 12, wherein said high AC bias power is in the range of 600 W to 1000 W.

17. The method of claim 12, wherein said lower AC bias power is 0 W.

18. The method of claim 12, wherein said low AC bias power step occurs prior to said high AC bias power step.

19. The method of claim 12, wherein said low AC bias power step occurs after said high AC bias power step.

20. A method of fabricating an integrated circuit comprising the steps of:

forming a dielectric layer over a semiconductor body;

forming a via in said dielectric layer;

forming a trench in said dielectric layer;

depositing a barrier layer over said dielectric layer including in said trench and said via;

depositing a first portion of a seed layer over said barrier layer using a low AC bias power;

depositing a second portion of said seed layer using a high AC bias power;

depositing a third portion of said seed layer using a lower AC bias power, wherein said high AC bias power is higher than both said low AC bias power and said lower AC bias power; and filling said hole with a metal using an electrochemical deposition process.

21. The method of claim 20, wherein said seed layer comprises copper.

22. The method of claim 20, wherein said seed layer comprises a copper alloy.

23. The method of claim 20, wherein said low AC bias power is in the range of 0 W to 400 W.

24. The method of claim 20, wherein said high AC bias power is in the range of 600 W to 1000 W.

25. The method of claim 20, wherein said lower AC bias power is 0 W.

26. The method of claim 20, wherein said seed layer has a final thickness and said first portion is 20% to 70% of said final thickness.

27. The method of claim 20, wherein said seed layer has a final thickness and said first portion is 50% to 60% of said final thickness.

28. The method of claim 20, wherein said seed layer has a final thickness and said second portion is 20% to 70% of said final thickness.

29. The method of claim 20, wherein said seed layer has a final thickness and said second portion is 30% to 40% of said final thickness.

30. The method of claim 20, wherein said seed layer has a final thickness and said first portion is 1% to 30% of said final thickness.

31. The method of claim 20, wherein said seed layer has a final thickness and said first portion is 10% to 20% of said final thickness.

* * * * *